United States Patent
Bjontegaard

[11] Patent Number: 5,488,420
[45] Date of Patent: Jan. 30, 1996

[54] COSMETICS FILTER FOR SMOOTHING REGENERATED PICTURES, E.G. AFTER SIGNAL COMPRESSING FOR TRANSMISSION IN A NARROWBAND NETWORK

[75] Inventor: Gisle Bjontegaard, Myrvoll, Norway

[73] Assignee: Teledirektoratets Forskningsavdeling, Norway

[21] Appl. No.: 204,256

[22] PCT Filed: Sep. 8, 1992

[86] PCT No.: PCT/NO92/00144

§ 371 Date: Apr. 20, 1994

§ 102(e) Date: Apr. 20, 1994

[87] PCT Pub. No.: WO93/05612

PCT Pub. Date: Mar. 18, 1993

[30] Foreign Application Priority Data

Sep. 9, 1991 [NO] Norway ................................ 91 3536

[51] Int. Cl.$^6$ .................................................. H04N 7/12
[52] U.S. Cl. ............................................ 348/419; 348/470
[58] Field of Search ............................. 348/17, 15, 419, 348/607, 470, 608, 466; H04N 7/12

[56] References Cited

U.S. PATENT DOCUMENTS

| | | | |
|---|---|---|---|
| 4,504,863 | 3/1985 | Lacoste | 358/167 |
| 4,700,226 | 10/1987 | Acampora | 348/419 |
| 4,709,260 | 11/1987 | Fedele et al. | 348/419 X |
| 5,018,179 | 5/1991 | Kaneko | 378/99 |
| 5,202,764 | 4/1993 | Ida et al. | 348/17 |

FOREIGN PATENT DOCUMENTS

| | | | |
|---|---|---|---|
| 0064192 | 11/1982 | European Pat. Off. | H04N 5/21 |
| 2173066 | 10/1986 | United Kingdom | H04N 5/213 |

Primary Examiner—Vicotr R. Kostak
Attorney, Agent, or Firm—Ladas & Parry

[57] ABSTRACT

Smoothing of regenerated digital pictures (e.g. after a heavy signal compression and coding for transmission on a narrowband medium) can be effected by means of a so-called "cosmetics filter" which filter comprises a digital lowpass filter, a delay, a subtraction unit, a table and an adder. An input signal enters the lowpass filter and the delay which is arranged in parallel with the lowpass filter. The difference between the delayed signal and the lowpass-filtered signal is used to address the table. An address content from the table is passed to the adder to be added to the lowpass-filtered signal from the lowpass filter, and the sum signal from the adder is the final filtered signal to the output from the cosmetics filter.

17 Claims, 2 Drawing Sheets

– – – – Reference line: TAB(X-XLOW) = X-XLOW

———— A possible shape of TAB(X-XLOW) to filter more heavily

COSMETICS FILTER FOR SMOOTHING REGENERATED PICTURES, E.G. AFTER SIGNAL COMPRESSING FOR TRANSMISSION IN A NARROWBAND NETWORK

FIELD OF THE INVENTION

The present invention relates to a so-called cosmetics filter of the type stated in the introductory part of the appended patent claim 1.

BACKGROUND OF THE INVENTION

In connection with electronic pictures like TV pictures, noise is often a problem. The noise with which one is most familiar, is what can be called thermal noise—or random noise. It is possible to achieve clearer and cleaner pictures if this type of noise is reduced somewhat.

Attempts have therefore been made to find methods for a reduction of this noise in the temporal domain by using various filtering techniques, which will often be based upon a type of recursive filter means. Examples of methods of such a type of noise reduction can be found in e.g. British patent application No. 2,020,941, U.S. Pat. No. 4,639,784 and German patent DE 33 11 898. All these patent publications are based upon a temporal picture filtering, so that the filtered picture will be less afflicted with noise, and hence present a more pleasant appearance, and simultaneously the signal time variation will not become veiled.

Lately one has started to use digital compression techniques to reduce bit consumption when representing single pictures or picture sequences (live pictures). These are e.g. techniques used in picture telephony. The coding technique itself is standardized by the international telecommunication organization CCITT. Live pictures are encoded in such a manner that they do not need a higher network transmission capacity than in the case of telephony. In order to succeed in such a task, the live picture must be compressed to such a degree that also visible distortion is introduced in the picture. This distortion has the effect that the picture looks a little less pleasant. In order to remedy this effect, it is possible to apply a subsequent filtering of the picture to give the picture a more pleasant appearance.

Thus, a situation exists where a great deal of knowledge exists regarding the generated noise. If one for example utilizes blocks when encoding pictures, one knows as a starting point that the block patterns will easily become visible and disfiguring. This information regarding the type of noise to be removed, becomes handy when the task is to construct a subsequent filter, i.e. a cosmetics filter. The goals to be achieved by means of such a filter can be summarized in this manner:

A removal of the noise generated in the encoding process, so that the result becomes subjectively pleasant to the eye, taking care that scars from possible block magnitudes in the encoding process will not become visible, and effecting the filtering in such a manner that no veiling or further lack of definition are introduced in the picture.

There exists a clear need for such cosmetics filters. One version of such a filter is described in "Motion video coding for visual telephony" by Ronald Plompen, PTT Research Neher Laboratories. This filter satisfies in general the requirements stated above, however the filter is rather demanding as to calculations. The described filter is intended used for block based encoding methods, and this assumes that the signal power is calculated for each respective block. This requires a lot of extra calculating power.

SUMMARY OF THE INVENTION

The purpose of the present invention is to provide a cosmetics filter which is less demanding regarding calculations, but which nevertheless gives approximately the same effect, i.e. in total a more cost efficient filter.

The present invention therefore provides a cosmetics filter for use in smoothing pictures which are regenerated after relatively heavy signal compression and coding in connection with e.g. transmission of live pictures via a narrowband transmission medium, where picture signals are described by digitalized samples constituting picture signals are described by digitalized samples constituting picture points, said cosmetics filter comprising: a digital lowpass filter having an input coupled to the input signal X and an output providing a lowpass filtered signal XLOW; a means for delaying having an input coupled to the input signal X and an output providing a delayed signal X; a means of subtracting signals having a first input coupled to the lowpass filter, a second input coupled to the delay means and an output providing a difference signal (X–XLOW); a table means having an address input coupled to the output of the signal subtracting means and an output providing a corresponding address content TAB(X–XLOW); and an adder having a first input coupled to the table means, a second input coupled to said lowpass filter, and an output, whereby a total-filtered signal Y=XLOW+TAB(X–XLOW) is provided at the output from said adder.

Further features and advantages of the invention appear from the attached dependent patent claims.

The invention shall now be described further by means of embodiment examples, and referring to the enclosed drawings, where

DETAILED DESCRIPTION OF THE PREFERRED EMBODIMENT

Figure 1:
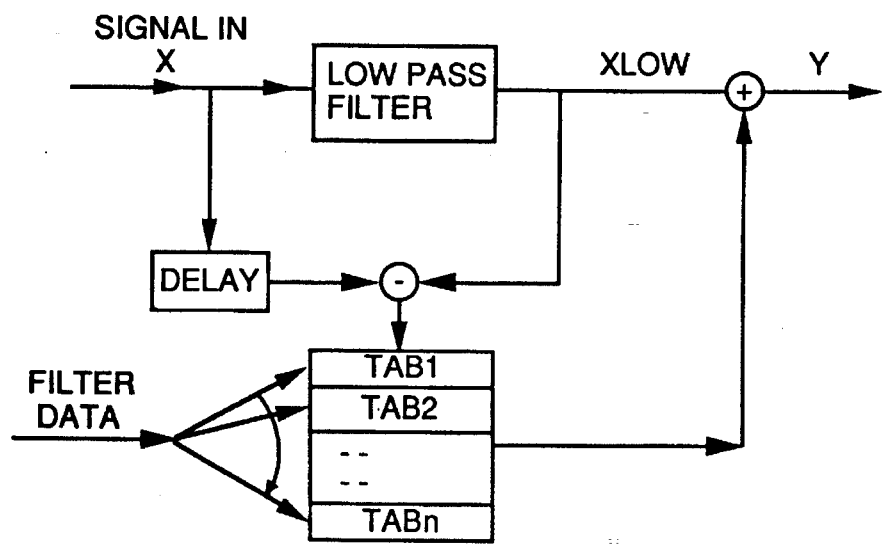
FIG. 1 shows the general structure of the cosmetics filter of the present invention.

In FIG. 1 is shown a sketch of the structure of the new filter. The signal X which is applied to the filter, is a sampled and digitalized signal, each respective sample representing a picture element (picture point). The signal X is distributed to two parallel branches, one of said branches containing a low pass filter and the other branch containing a delay means. The output signals from respectively the delay means and the lowpass filter as passed to a subtraction unit, and the difference between the signals are used as an address to a table TAB, and the content of said address is output as a result and returned to an adder which also receives the lowpass filtered signal XLOW. The sum of said lowpass filtered signal XLOW and the table value, constitutes the ready filtered signal Y, i.e. in such a manner:

$$Y = XLOW + TAB(X-XLOW).$$

It appears from the figure that the table means contains several optional tables, designated TAB1, TAB2, ... TABn, and the decision regarding which table should be used in a particular case, can be made on the basis of data from the rest of the equipment, thereby providing a possibility of controlling the degree of the signal filtering. This choice can be controlled and changed as often or as seldom as one likes, and hence the filtering degree can be adapted to the signal present. Thus, the filter can be described as follows:

$$Y=XLOW+TABk(X-XLOW).$$

To repeat, the meaning of the various parameters is as follows:
X: unfiltered data input,
XLOW: lowpass filtered data,
Y: filtered data output,
TAB1 ... N: a number of pre-set tables which determine the filtering degree,
DELAY: a delay means which makes the signal input and the XLOW signal meet each other at the correct time, and
LOWPASS FILTER is a lowpass filter which in its simplest form may operate by mean value calculation or average value calculation of a few picture points surrounding the picture point in question.

A clear advantage of the present cosmetics filter above other previously known filters, e.g. the filter previously mentioned, is the very simple implementing thereof. I.e. the filter effect can be provided by means of few calculations. This is important, since the data flow in a picture signal is very high. The calculating operations required for this filter are merely:

The lowpass filter function, which in its simplest form may consist of a mean value calculation of picture points, and TABk, which quite simply is a table, in the sense that the input signal is used as an address to the table, and the content of this address is the result of the operation. Such a table look-up is a "cheap" operation.

Figure 2:
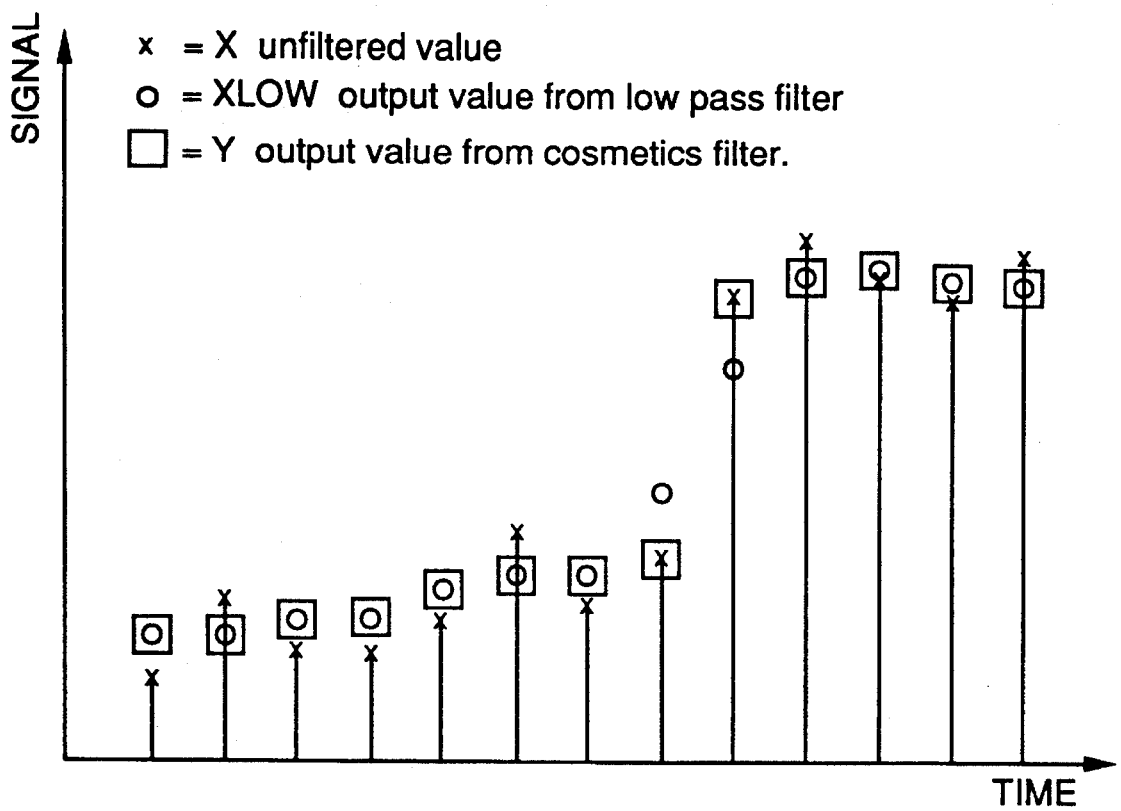
FIG. 2 shows the time variation of a signal in sampled form, as well as the effect of a certain type of filtering.

In order to give a simple example of the filter function, it is referred to FIG. 2. Here is shown a representation of a signal which is originally an analogue signal, i.e. the representation is a sampled signal as a function of time. The values X prior to filtering are shown by means of a cross. The output values XLOW from the lowpass filter are shown as circles, and the output values Y from the cosmetics filter are shown as squares. The signal may for example represent a time variable light intensity along e.g. a horizontal line in a TV screen, where the signal was originally an analogue signal, but is here represented by means of samples which as a starting point are transmitted sequentially in a digital form.

Interpreted as a horizontal line scan on the screen, a genuine signal variation which results in a picture-forming contour, will represent a marked "jump" in a signal shape as the one shown in FIG. 2. In order to preserve such jumps, but at the same time remove minor variations which are due to noise from the signal processing, the cosmetics filter will here operate in the following manner: The lowpass filter operates in almost the simplest manner conceivable, namely by mean value calculating over three values "input" to the filter, i.e. the signal value X in question, plus the nearest value on each respective side, divided by three, giving as a result the shown XLOW (circle), and consequently a smoothing or lowpass filtering of the curve.

It will be clear that in most cases there will be achieved a small difference X−XLOW, while at the more abrupt transition a little to the right in the diagram, X−XLOW will exhibit a larger absolute value.

The total filter should not make nay substantial change at the abrupt transition, while a smoothing effect is desirable in the other cases. The filtering effect must therefore depend on the magnitude of X−XLOW, i.e. the filter must contain a function of (X−XLOW). This function is here represented by a table look-up operation, i.e. TAB, and the total filter consequently operates in accordance with the above mentioned formulae.

The table function TAB is constructed so as to:
I  make Y→XLOW when the absolute value (X−XLOW) is small,
II make Y→X when the absolute value of (X−XLOW) is large.

I In this case it is assumed that (X−XLOW) represents noise which has been introduced in the picture coding process. This noise is removed (or actually reduced) by equating Y to the filtered value XLOW. The filtering achieved thereby will not de-sharpen the picture since a small (X−XLOW) indicates that there are no sharp details.

II When (X−XLOW) is large, it is assumed that this is due to the picture content, and not due to noise. One therefore lets Y assume a value close to X. Thus, details in the picture will not be filtered away.

Figure 3:
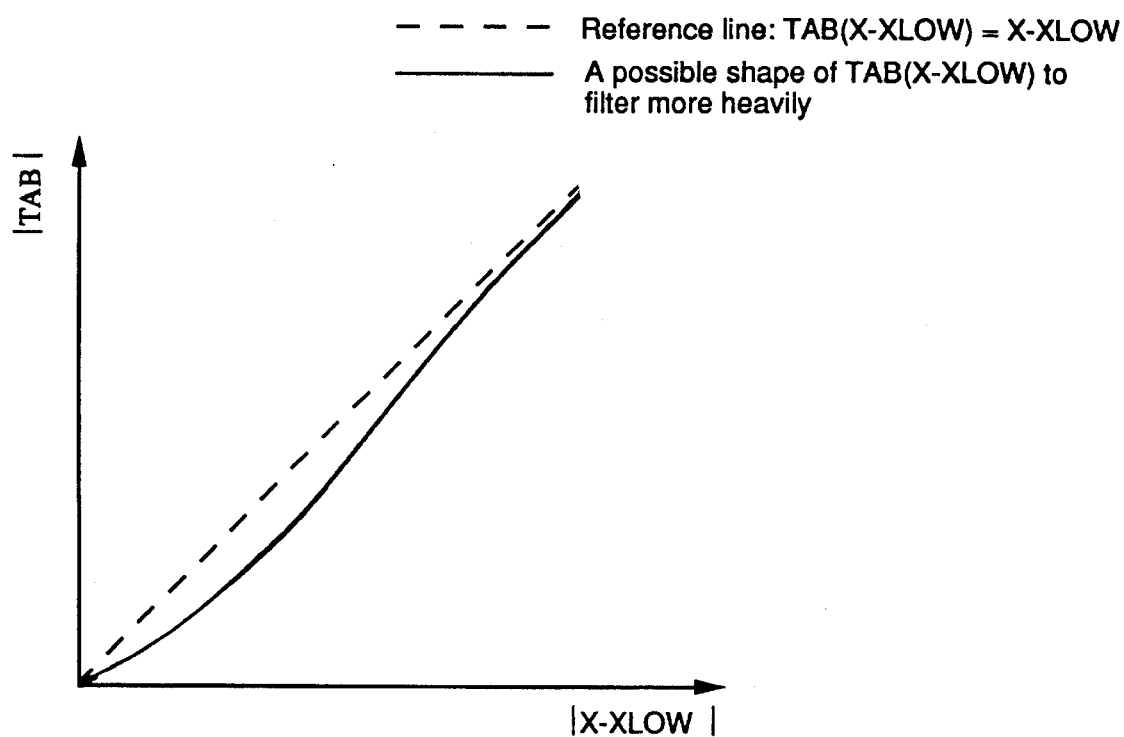
FIG. 3 shows a possible form of an important function which is part of the total filter function.

In FIG. 3 there is indicated a possible form of TAB, but in reality TAB is constituted, as previously mentioned, by a stored table, or preferably several tables among which one can be selected. As an address to a table is used (X−XLOW) as previously mentioned.

However, the filter can be used in several different ways. It shall first be established that a single picture can be regarded as a two-dimensional signal, i.e. with a horizontal (H) and a vertical (V) dimension, while a live picture can be regarded as a three-dimensional signal with a horizontal, a vertical and a temporal (T) dimension. Which one of these dimensions the filter operates in relation to, is determined by the dimensions for which the lowpass filter operates. By e.g. calculating mean values for points in only one direction, (i.e. alternatively H, V or T direction), the filtering is effected only in this single dimension. However, the lowpass filter may very well operate in more dimensions simultaneously, e.g. by having the filter calculate mean values over a small block in the picture plane (HV combined), or e.g. over several blocks in the same position, but which blocks follow each other in time (HVT combined).

Thus, the filter can be used in one or more dimensions. If it is used in several dimensions, one may also arrange the lowpass filter as two directly consecutive single filters, or as a combination-operating filter over the two same dimensions. For instance, a filter over horizontal and vertical direction may be realized as H+V, i.e. first in the horizontal direction and thereafter in the vertical direction, or HV, i.e. the filter operates by itself simultaneously in both horizontal and vertical direction.

(through the operating mode of the lowpass filter).

In the same manner, e.g. a filter which is intended to operate in all three dimensions, may be of the types H+V+T, or HVT.

What is claimed is:

1. A cosmetics filter for use in smoothing pictures which are regenerated after signal compression and coding in connection with e.g. transmission of live pictures via a narrowband transmission medium, where picture signals are described by digitalized samples constituting picture points, said cosmetics filter comprising:

a digital lowpass filter having an input coupled to the input signal X and an output providing a lowpass-filtered signal XLOW;

a means for delaying having an input coupled to the input signal X and an output providing a delayed signal X;

a means of subtracting signals having a first input coupled to the lowpass filter, a second input coupled to the delay means and an output providing a difference signal (X−XLOW);

a table means having an address input coupled to the output of the signal subtracting means and an output providing a corresponding address content TAB(X−XLOW); and an adder having a first input coupled to the table means, a second input coupled to said lowpass filter, and an output, whereby a total-filtered signal Y=XLOW+ TAB(X−XLOW) is provided at the output from said adder.

2. The filter in accordance with claim 1, wherein the lowpass filter provides an average value for a certain number of picture points surrounding the point in question.

3. The filter in accordance with claim 1, wherein said table means contains a number N of pre-set tables to be selected in accordance with the desired filtering degree, where Y=XLOW+ $TAB_k$(X−XLOW) where k=1, 2, . . . N.

4. The filter in accordance with one of claim 1–3, wherein said lowpass filter is adapted to operate in a horizontal or vertical direction in the picture.

5. The filter in accordance with one of claims 1–3, wherein said lowpass filter is adapted to operated in the temporal dimension of said picture, i.e. e.g. by calculating a mean value at the same picture point position over a number of consecutive pictures.

6. The filter in accordance with one of claims 1–3, wherein said lowpass filter is adapted to operate in both a horizontal and vertical direction simultaneously, i.e. e.g. by calculating a mean value over a number of points in a picture block surrounding the point in question.

7. The filter in accordance with claim 6, wherein one single lowpass filter executes the complete lowpass-filtering in one single operation.

8. The filter in accordance with claim 6, wherein at least two single lowpass filters execute their own respective one-dimensional lowpass-filtering operation.

9. The filter in accordance with one of claim 1–3, wherein said lowpass filter is adapted to operate simultaneously in both the temporal dimension of the picture and a vertical direction.

10. The filter in accordance with claim 9, wherein one single lowpass filter executes the complete lowpass-filtering in one single operation.

11. The filter in accordance with claim 9, wherein at least two single lowpass filters execute their own respective one-dimensional lowpass-filtering operation.

12. The filter in accordance with one of claims 1–3, wherein said lowpass filter is adapted to operate simultaneously in both the temporal dimension of the picture and a horizontal direction.

13. The filter in accordance with claim 12, wherein one single lowpass filter executes the complete lowpass-filtering in one single operation.

14. The filter in accordance with claim 12, wherein at least two single lowpass filters execute their own respective one-dimensional lowpass-filtering operation.

15. The filter in accordance with one of claim 1–3, wherein said lowpass filter is adapted to operate simultaneously in both the temporal dimension of the picture and a vertical and horizontal direction.

16. The filter in accordance with claim 15, wherein one single lowpass filter executes the complete lowpass-filtering in one single operation.

17. The filter in accordance with claim 15, wherein at least two single lowpass filters execute their own respective one-dimensional lowpass-filtering operation.

* * * * *